United States Patent
Li et al.

(10) Patent No.: US 10,923,468 B2
(45) Date of Patent: Feb. 16, 2021

(54) ELECTROSTATIC PROTECTION CIRCUIT, ARRAY SUBSTRATE, AND DISPLAY DEVICE

(71) Applicant: BOE TECHNOLOGY GROUP CO., LTD., Beijing (CN)

(72) Inventors: Pan Li, Beijing (CN); Yong Qiao, Beijing (CN); Xueguang Hao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/611,431

(22) PCT Filed: Apr. 4, 2019

(86) PCT No.: PCT/CN2019/081586
§ 371 (c)(1),
(2) Date: Nov. 6, 2019

(87) PCT Pub. No.: WO2019/233173
PCT Pub. Date: Dec. 12, 2019

(65) Prior Publication Data
US 2021/0013194 A1   Jan. 14, 2021

(30) Foreign Application Priority Data

Jun. 4, 2018  (CN) .................... 2018 2 0855116 U

(51) Int. Cl.
*H01L 27/02*  (2006.01)
*H01L 27/12*  (2006.01)

(52) U.S. Cl.
CPC ...... *H01L 27/0296* (2013.01); *H01L 27/0292* (2013.01); *H01L 27/1244* (2013.01)

(58) Field of Classification Search
None
See application file for complete search history.

(56) References Cited

U.S. PATENT DOCUMENTS 8,878,572 B2   11/2014  Akiyama et al.
9,225,166 B2   12/2015  Li
(Continued)

FOREIGN PATENT DOCUMENTS

CN   104113053 A   10/2014
CN   206271707 U    6/2017
(Continued)

OTHER PUBLICATIONS

International Search Report and Written Opinion, PCT/CN2019/081586, BOE Technology Group Co., Ltd., (Jul. 5, 2019).

*Primary Examiner* — Steven M Christopher
(74) *Attorney, Agent, or Firm* — Arch & Lake LLP

(57) ABSTRACT

The present disclosure provides an electrostatic protection circuit, an array substrate, and a display device. The electrostatic protection circuit includes: a first voltage line, to which a high level voltage is applied; a second voltage line, to which a low level voltage is applied; and a switch assembly, including a plurality of first switch units and a plurality of second switch units arranged along a straight line and sharing an active layer. The first switch units are respectively coupled between the signal lines and the first voltage line, and are turned on in response to negative static electricity on the signal lines. The second switch units are respectively coupled between the signal lines and the second voltage line, and are turned on in response to positive static electricity on the signal lines. The signal lines are arranged in a peripheral region of the array substrate.

20 Claims, 2 Drawing Sheets

(56) References Cited

U.S. PATENT DOCUMENTS

| | | | | |
|---|---|---|---|---|
| 2014/0253182 A1* | 9/2014 | Akiyama | ............... | H03K 5/153 |
| | | | | 327/109 |
| 2015/0303686 A1* | 10/2015 | Li | ......................... | H02H 9/046 |
| | | | | 361/56 |
| 2016/0216548 A1* | 7/2016 | Fujikawa | ............... | H01L 27/124 |
| 2018/0033806 A1* | 2/2018 | Long | ................... | H01L 27/1244 |
| 2019/0386039 A1* | 12/2019 | Han | ................... | H01L 27/0296 |

FOREIGN PATENT DOCUMENTS

| CN | 107507827 A | 12/2017 |
|---|---|---|
| CN | 208189588 U | 12/2018 |
| WO | WO-2019/041605 A1 | 3/2019 |

\* cited by examiner

ELECTROSTATIC PROTECTION CIRCUIT, ARRAY SUBSTRATE, AND DISPLAY DEVICE

CROSS-REFERENCE

This application is based upon International Application No. PCT/CN2019/081586, filed on Apr. 4, 2019, which is based upon and claims priority to Chinese Utility Model Patent Application No. 201820855116.7, titled "ELECTROSTATIC PROTECTION CIRCUIT, ARRAY SUBSTRATE, AND DISPLAY DEVICE" and filed on Jun. 4, 2018, the entire contents of which are incorporated herein by reference.

TECHNICAL FIELD

The present disclosure generally relates to the field of display technologies, and more particularly, to an electrostatic protection circuit, an array substrate, and a display device.

BACKGROUND

At present, display devices such as liquid crystal displays and organic light emitting diode displays have been widely used. Such a display device includes a plurality of signal lines such as scan lines and data lines to drive a plurality of pixels of the display device, which are arranged in a matrix.

When the display device is used, static electricity may be introduced into the display device along the signal lines, which may damage internal components of the display device. It is generally needed to arrange an electrostatic protection or electrostatic discharge (ESD) circuit in the display device to prevent the internal components of the display device from being damaged due to the static electricity introduced into the display device.

Typically, such an electrostatic protection circuit is arranged in a peripheral region of an array substrate of the display device. In this case, if the electrostatic protection circuit occupies a larger area of the peripheral region of the array substrate, this is disadvantageous to narrow bezel design of the display device.

Therefore, it is desirable to reduce the area occupied by the electrostatic protection circuit.

SUMMARY

Arrangements of the present disclosure relate to an electrostatic protection circuit, an array substrate, and a display device.

According to an aspect of the present disclosure, there is provided an electrostatic protection circuit. The electrostatic protection circuit includes a first voltage line, applied with a high level voltage. The electrostatic protection circuit includes a second voltage line, applied with a low level voltage. The electrostatic protection circuit includes a switch assembly, which includes a plurality of first switch units and a plurality of second switch units arranged along a straight line and sharing an active layer. The plurality of first switch units are respectively coupled between a plurality of signal lines and the first voltage line, and are turned on in response to negative static electricity on the signal lines. The plurality of second switch units are respectively coupled between the plurality of signal lines and the second voltage line, and are turned on in response to positive static electricity on the signal lines.

According to some arrangements, the plurality of signal lines are arranged in a peripheral region of an array substrate.

According to some arrangements, the straight line along which the plurality of first switch units and the plurality of second switch units are arranged is arranged at a side of the plurality of signal lines.

According to some arrangements, the first switch unit and the second switch unit corresponding to a same signal line are arranged adjacent to each other.

According to some arrangements, the first switch unit and the second switch unit corresponding to the same signal line forms a switch unit group, and the switch unit group corresponding to the same signal line is coupled to the signal line through a same signal line-connecting line.

According to some arrangements, the switch unit groups adjacent to each other are arranged in such a way that the first switch units are adjacent to each other or the second switch units are adjacent to each other.

According to some arrangements, the first switch units adjacent to each other are coupled to the first voltage line through a same first voltage line-connecting line, and the second switch units adjacent to each other are coupled to the second voltage line through a same second voltage line-connecting line.

According to some arrangements, the switch assembly includes a first switch assembly and a second switch assembly. The first switch units and the second switch units of the first switch assembly are arranged along a first straight line. The first switch units and the second switch units of the second switch assembly are arranged along a second straight line parallel to the first straight line.

According to some arrangements, the plurality of signal lines include a plurality of first signal lines and a plurality of second signal lines, the first straight line along which the first switch assembly is arranged and the second straight line along which the second switch assembly is arranged are arranged between the plurality of first signal lines and the plurality of second signal lines.

According to some arrangements, at least one of the first switch units in the first switch assembly and at least one of the first switch units in the second switch assembly are coupled to the first voltage line through a same first voltage line-connecting line, and at least one of the second switch units in the first switch assembly and at least one of the second switch units in the second switch assembly are coupled to the second voltage line through a same second voltage line-connecting line.

According to some arrangements, the first switch unit includes a first transistor and a second transistor connected in series, and the second switch unit includes a third transistor and a fourth transistor connected in series.

According to some arrangements, a first terminal of the first transistor is coupled to the signal line, and a gate and a second terminal of the first transistor are coupled to each other. A first terminal of the second transistor is coupled to the second terminal of the first transistor. A second terminal and a gate of the second transistor are coupled to each other and are coupled to the first voltage line. A first terminal and a gate of the third transistor are coupled to each other and are coupled to the signal line. A first terminal and a gate of the fourth transistor are coupled to each other and are coupled to a second terminal of the third transistor. A second terminal of the fourth transistor is coupled to the second voltage line.

According to some arrangements, the first transistor, the second transistor, the third transistor, and the fourth transistor share the active layer arranged along the straight line.

According to some arrangements, according to another aspect of the present disclosure, there is provided an array substrate, including a plurality of signal lines, arranged in a peripheral region of the array substrate; and the electrostatic protection circuit described above, coupled to the plurality of signal lines.

According to some arrangements, the first voltage line of the electrostatic protection circuit includes a gate high-voltage signal line, and the second voltage line of the electrostatic protection circuit includes a gate low-voltage signal line.

According to yet another aspect of the present disclosure, there is provided a display device, including the array substrate described above.

BRIEF DESCRIPTION OF THE DRAWINGS

The accompanying drawings are included to provide further understanding of the present disclosure. The accompanying drawings herein are incorporated in and constitute a part of this application, illustrate arrangements of the present disclosure and, together with the description, serve to explain the principles of the present disclosure. In the drawings.

DETAILED DESCRIPTION

The example arrangements of the present disclosure will now be described more fully with reference to the accompanying drawings. However, these arrangements can be implemented in a variety of forms and should not be construed as limited to the examples set forth herein. Rather, these arrangements are provided so that the present disclosure will be more thorough and complete and will fully convey the concepts of present disclosure to those skilled in the art. The features, structures, or characteristics described may be combined in one or more arrangements in any suitable manner.

It will be further understood that, the term "include" and/or "comprise" used in this specification refers to the presence of the characteristics, integers, elements and/or components, but not exclusive of the presence or addition of one or more other characteristics, integers, elements, components and/or groups thereof.

The present disclosure will be explained in detail hereinafter with reference to the accompanying drawings.

Figure 1:
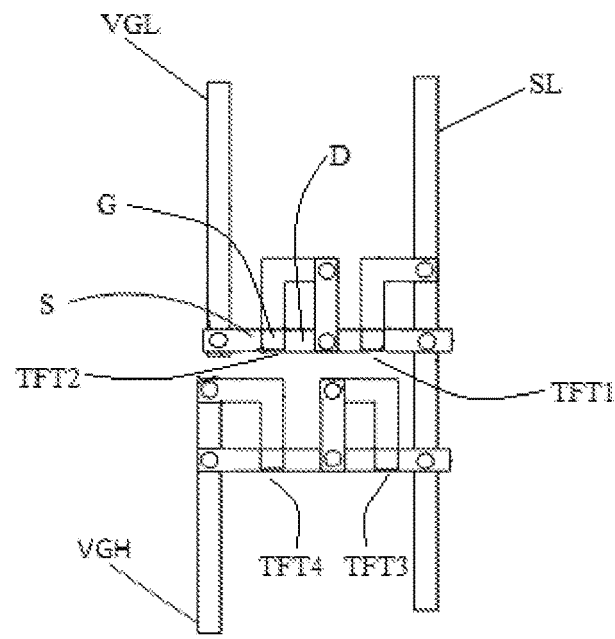
FIG. 1 illustrates a schematic diagram of an electrostatic protection circuit.

FIG. 1 illustrates a schematic diagram of an electrostatic protection circuit.

As shown in FIG. 1, the electrostatic protection circuit connects a signal line SL to a low-level voltage line (for example, a gate low-voltage signal line) VGL and a high-level voltage line (for example, a gate high-voltage signal line) VGH respectively through two transistors connected in series, so as to lead out positive static electricity and negative static electricity from the signal line SL through the low-level voltage line VGL and the high-level voltage line VGH, respectively, such that internal components of a display device are prevented from being damaged by high-voltage static electricity on the signal line SL.

Specifically, the signal line SL is coupled to the low-level voltage line VGL through a first transistor TFT1 and a second transistor TFT2. The first transistor TFT1 includes a drain coupled to the signal line SL, a gate coupled to the drain thereof and the signal line SL, and a source coupled to a drain of the second transistor TFT2. The second transistor TFT2 includes the drain coupled to the source of the first transistor TFT1, a source coupled to the low-level voltage line VGL, and a gate coupled to the drain thereof. When positive static electricity is applied to the signal line SL, the first transistor TFT1 and the second transistor TFT2 are turned on in response to the positive static electricity, and the positive static electricity on the signal line SL is led to the low-level voltage line VGL, such that the high-voltage positive static electricity is prevented from being transmitted along the signal line SL to internal components of a display device and damaging the same.

The signal line SL is also coupled to the high-level voltage line VGH through a third transistor TFT3 and a fourth transistor TFT4. The third transistor TFT3 includes a source coupled to the signal line SL, a drain coupled to a source of the fourth transistor TFT4, and a gate coupled to the drain thereof. The fourth transistor TFT4 includes a source coupled to the drain of the third transistor TFT3, a drain coupled to the high-level voltage line VGH, and a gate coupled to the drain thereof and the high-level voltage line VGH. When negative static electricity is applied to the signal line SL, the third transistor TFT3 and the fourth transistor TFT4 are turned on in response to the negative static electricity, and the negative static electricity on the signal line SL is led to the high-level voltage line VGH, such that the high-voltage negative static electricity is prevented from being transmitted along the signal line SL to internal components of a display device and damaging the same.

In the electrostatic protection circuit structure as shown in FIG. 1, a plurality of signal lines of the display device are separately provided with such an electrostatic protection circuit, and each of the electrostatic protection circuits is separately provided with an active layer (i.e., the active layer of the electrostatic protection circuit corresponding to one signal line is arranged separately from the active layer of the electrostatic protection circuit corresponding to another signal line). Thus, the electrostatic protection circuit occupies a larger area of a peripheral region of an array substrate, which is disadvantageous to a narrow bezel design of the display device.

An example arrangement of the present disclosure provides an electrostatic protection circuit, and the electrostatic protection circuit occupies a smaller area of the peripheral region of the array substrate, which is desirable for the narrow bezel design of the display device.

Figure 2:
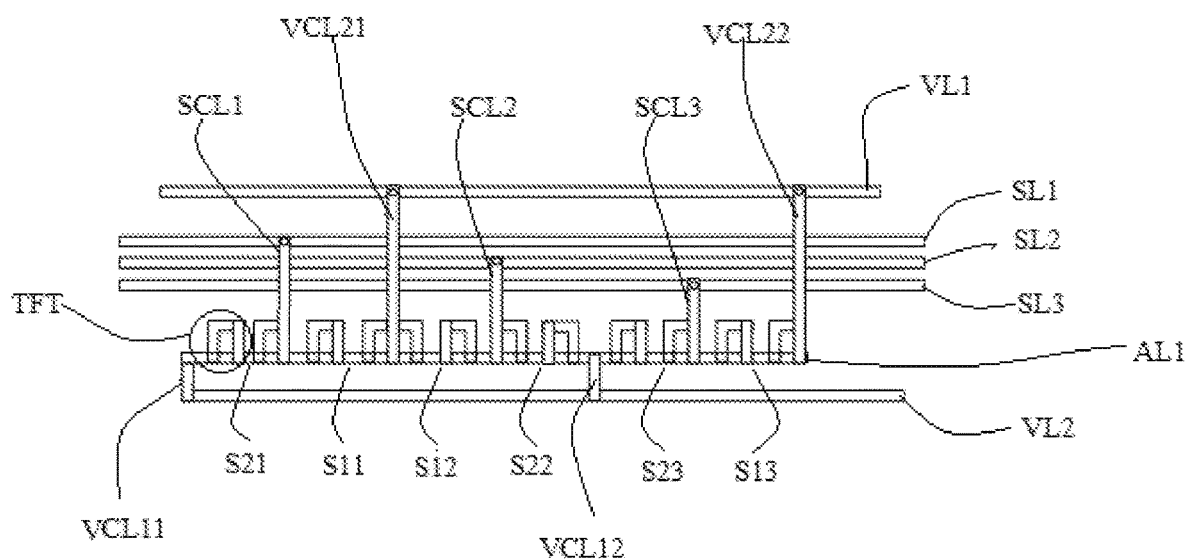
FIG. 2 illustrates a schematic diagram of an electrostatic protection circuit according to an example arrangement of the present disclosure.

FIG. 2 illustrates a schematic diagram of an electrostatic protection circuit according to an example arrangement of the present disclosure.

As shown in FIG. 2, the electrostatic protection circuit may be used for a plurality of signal lines including a first signal line SL1, a second signal line SL2, and a third signal line SL3. Here, the plurality of signal lines are arranged in a peripheral region of an array substrate, i.e., a region other than a display region of the array substrate. Although only three signal lines are shown here for the ease of description, it is clear to those skilled in the art that more signal lines may be arranged. For example, four or more signal lines may be arranged.

The electrostatic protection circuit may include: a first voltage line VL1, to which a high level voltage is applied; a second voltage line VL2, to which a low level voltage is applied; and a switch assembly, including a plurality of first switch units S11-S13 and a plurality of second switch units S21-S23 arranged along a straight line and sharing an active layer AL1. Here, the straight line along which the plurality of first switch units S11-S13 and the plurality of second switch units S21-S23 are arranged extends substantially along the direction of the signal line.

Here, the plurality of first switch units S11-S13 are respectively coupled between the plurality of signal lines SL1-SL3 and the first voltage line VL1, and are turned on in response to negative static electricity on the signal lines SL1-SL3. Thus, the negative static electricity on the signal lines SL1-SL3 is led to the first voltage line VL1, such that the high-voltage negative static electricity on the signal lines SL1-SL3 is prevented from being transmitted to internal components of the display device and damaging the same.

The plurality of second switch units S21-S23 are respectively coupled between the plurality of signal lines SL1-SL3 and the second voltage line VL2, and are turned on in response to positive static electricity on the signal lines SL1-SL3. Thus, the positive static electricity on the signal lines SL1-SL3 is led to the second voltage line VL2, such that the high-voltage positive static electricity on the signal lines SL1-SL3 is prevented from being transmitted to internal components of the display device and damaging the same.

As mentioned above, in the electrostatic protection circuit provided by this example arrangement, the plurality of first switch units and the plurality of second switch units used for the plurality of signal lines are arranged along a straight line and share an active layer. Therefore, the electrostatic protection circuit occupies a smaller area, which is desirable for the narrow bezel design of the display device.

In some arrangements, the first voltage line VL1 to which the high level voltage is applied may be the gate high-voltage signal line in the display device, and the second voltage line VL2 to which the low level voltage is applied may be the gate low-voltage signal line in the display device. However, the present disclosure is not limited thereto, and the first voltage line VL1 and the second voltage line VL2 may be a voltage line to which a high level voltage is applied and a voltage line to which a low level voltage is applied, both of which are separately arranged in the display device.

As shown in FIG. 2, the first switch units S11-S13 are coupled to the first voltage line VL1 through a plurality of voltage line-connecting lines VCL11 and VCL12 respectively, and are coupled to the first signal line SL1 to the third signal line SL3 through a plurality of signal line-connecting lines SCL1-SCL3 respectively. The second switch units S21-S23 are coupled to the second voltage line VL2 through a plurality of voltage line-connecting lines VCL21 and VCL22 respectively, and are coupled to the first signal line SL1 to the third signal line SL3 through the plurality of signal line-connecting lines SCL1-SCL3 respectively.

Specifically, one end of the first switch unit S11 is coupled to the first signal line SL1 through a first signal line-connecting line SCL1, the other end of the first switch unit S11 is coupled to the first voltage line VL1 through a second voltage line-connecting line VCL21, and thus the first switch unit S11 is coupled between the first signal line SL1 and the first voltage line VL1. In addition, the first switch unit S11 is turned on in response to negative static electricity on the first signal line SL1. Thus, the high-voltage negative static electricity on the first signal line SL1 is transmitted to the first voltage line VL1, and thus is prevented from being transmitted to the internal components of the display device and damaging the same.

One end of the second switch unit S21 is coupled to the first signal line SL1 through the first signal line-connecting line SCL1, the other end of the second switch unit S21 is coupled to the second voltage line VL2 through a first voltage line-connecting line VCL11, and thus the second switch unit S21 is coupled between the first signal line SL1 and the second voltage line VL2. In addition, the second switch unit S21 is turned on in response to positive static electricity on the first signal line SL1. Thus, the high-voltage positive static electricity on the first signal line SL1 is transmitted to the second voltage line VL2, and thus is prevented from being transmitted to the internal components of the display device and damaging the same.

One end of the first switch unit S12 is coupled to the second signal line SL2 through a second signal line-connecting line SCL2, the other end of the first switch unit S12 is coupled to the first voltage line VL1 through the second voltage line-connecting line VCL21, and thus the first switch unit S12 is coupled between the second signal line SL2 and the first voltage line VL1. In addition, the first switch unit S12 is turned on in response to negative static electricity on the second signal line SL2. Thus, the high-voltage negative static electricity on the second signal line SL2 is transmitted to the first voltage line VL1, and thus is prevented from being transmitted to the internal components of the display device and damaging the same.

One end of the second switch unit S22 is coupled to the second signal line SL2 through the second signal line-connecting line SCL2, the other end of the second switch unit S22 is coupled to the second voltage line VL2 through a third voltage line-connecting line VCL12, and thus the second switch unit S22 is coupled between the second signal line SL2 and the second voltage line VL2. In addition, the second switch unit S22 is turned on in response to positive static electricity on the second signal line SL2. Thus, the high-voltage positive static electricity on the second signal line SL2 is transmitted to the second voltage line VL2, and thus is prevented from being transmitted to the internal components of the display device and damaging the same.

One end of the first switch unit S13 is coupled to the third signal line SL3 through a third signal line-connecting line SCL3, the other end of the first switch unit S13 is coupled to the first voltage line VL1 through a fourth voltage line-connecting line VCL22, and thus the first switch unit S13 is coupled between the third signal line SL3 and the first voltage line VL1. In addition, the first switch unit S13 is turned on in response to negative static electricity on the third signal line SL3. Thus, the high-voltage negative static electricity on the third signal line SL3 is transmitted to the first voltage line VL1, and thus is prevented from being transmitted to the internal components of the display device and damaging the same.

One end of the second switch unit S23 is coupled to the third signal line SL3 through the third signal line-connecting line SCL3, the other end of the second switch unit S23 is coupled to the second voltage line VL2 through the third voltage line-connecting line VCL12, and thus the second switch unit S23 is coupled between the third signal line SL3 and the second voltage line VL2. In addition, the second switch unit S23 is turned on in response to positive static electricity on the third signal line SL3. Thus, the high-voltage positive static electricity on the third signal line SL3 is transmitted to the second voltage line VL2, and thus is prevented from being transmitted to the internal components of the display device and damaging the same.

In some arrangements, the first switch unit and the second switch unit corresponding to the same signal line may be arranged adjacent to each other. As shown in FIG. 2, the first switch unit S11 and the second switch unit S21 corresponding to the first signal line SL1 may be arranged adjacent to each other. The first switch unit S12 and the second switch S22 corresponding to the second signal line SL2 may be arranged adjacent to each other. The first switch unit S13 and the second switch unit S23 corresponding to the third signal line SL3 may be arranged adjacent to each other.

The above arrangement may effectively reduce the number of the signal line-connecting lines. Specifically, a group of the first switch unit and the second switch unit corresponding to the same signal line may be referred as a switch unit group, and the switch unit group corresponding to the same signal line may be coupled to the signal line through the same signal line-connecting line. For example, as shown in FIG. 2, the first switch unit S11 and the second switch unit S21, the first switch unit S12 and the second switch unit S22, and the first switch unit S13 and the second switch unit S23 may constitute switch unit groups respectively. The switch unit group (hereinafter referred to as the first switch unit group) constituted by the first switch unit S11 and the second switch unit S21 is coupled to the first signal line SL1 through the first signal line-connecting line SCL1. The switch unit group (hereinafter referred to as the second switch unit group) constituted by the first switch unit S12 and the second switch unit S22 is coupled to the second signal line SL2 through the second signal line-connecting line SCL2. The switch unit group (hereinafter referred to as the third switch unit group) constituted by the first switch unit S13 and the second switch unit S23 is coupled to the third signal line SL3 through the third signal line-connecting line SCL3. As can be seen from the above, such an arrangement may allow the signal line-connecting line to be shared by the switch units. For example, the first signal line-connecting line SCL1 may be shared by the first switch unit S11 and the second switch unit S21, the second signal line-connecting line SCL2 may be shared by the first switch unit S12 and the second switch unit S22, and the third signal line-connecting line SCL3 may be shared by the first switch unit S13 and the second switch unit S23. Thus, the number of the signal line-connecting lines may be effectively reduced, which is desirable for reducing the area occupied by the electrostatic protection circuit.

In some arrangements, the switch unit groups adjacent to each other may be arranged in such a way that the first switch units are adjacent to each other or the second switch units are adjacent to each other. As shown in FIG. 2, the first switch unit group and the second switch unit group adjacent to each other are arranged in such a way that the first switch unit S11 and the first switch unit S12 are adjacent to each other. The second switch unit group and the third switch unit group adjacent to each other are arranged in such a way that the second switch unit S22 and the second switch unit S23 are adjacent to each other.

The above arrangement may effectively reduce the number of the voltage line-connecting lines. Specifically, in such an arrangement, the first switch units adjacent to each other may be coupled to the first voltage line through the same voltage line-connecting line, and the second switch units adjacent to each other may be coupled to the second voltage line through the same voltage line-connecting line. For example, as shown in FIG. 2, the first switch units S11 and S12 adjacent to each other are coupled to the first voltage line VL1 through the second voltage line-connecting line VCL21, and the second switch units S22 and S23 adjacent to each other are coupled to the second voltage line VL2 through the third voltage line-connecting line VCL12. As can be seen from the above, such an arrangement may allow the voltage line-connecting line to be shared by the switch units adjacent to each other. For example, the second voltage line-connecting line VCL21 may be shared by the first switch units S11 and S12 adjacent to each other, and the third voltage line-connecting line VCL12 may be shared by the second switch units S22 and S23 adjacent to each other. Thus, the number of the voltage line-connecting lines may be effectively reduced, which is desirable for reducing the area occupied by the electrostatic protection circuit.

In some arrangements, each of the first switch units S11-S13 includes a first transistor and a second transistor connected in series, which is similar, for example, to the third transistor TFT3 and the fourth transistor TFT4 connected in series as shown in FIG. 1. Each of the second switch units S21-S23 includes a third transistor and a fourth transistor connected in series, which is similar, for example, to the first transistor TFT1 and the second transistor TFT2 connected in series as shown in FIG. 1.

Specifically, by taking the first switch unit S11 and the second switch unit S21 as an example, a first terminal (e.g., a source) of the first transistor included in the first switch unit S11 is coupled to the first signal line SL1 through the first signal line-connecting line SCL1, and a gate and a second terminal (e.g., a drain) of the first transistor are coupled to each other. A first terminal (e.g., a source) of the second transistor included in the first switch unit S11 is coupled to the second terminal of the first transistor, and a second terminal (e.g., a drain) and a gate of the second transistor are coupled to each other and are coupled to the first voltage line VL1 through the second voltage line-connecting line VCL21. A first terminal (e.g., a drain) and a gate of the third transistor included in the second switch unit S21 are coupled to each other and are coupled to the first signal line SCL1 through the first signal line SCL1. A first terminal (e.g., a drain) and a gate of the fourth transistor included in the second switch unit S21 are coupled to each other and are coupled to a second terminal (e.g., a source) of the third transistor, and a second terminal (e.g., a source) of the fourth transistor is coupled to the second voltage line VL2 through the first voltage line-connecting line VCL1.

The first transistors and the second transistors of the first switch units S12-S13 as well as the third transistors and the fourth transistors of the second switch units S22-S23 may be arranged similarly to the first switch unit S11 and the second switch unit S21, and detailed descriptions thereof are omitted herein.

In addition, in this case, all the first transistors, the second transistors, the third transistors and the fourth transistors in the switch assembly may be arranged along the straight line and share the active layer. That is, sources and drains of the first transistors, the second transistors, the third transistors and the fourth transistor are arranged along the straight line, and the active layer shared by them is also arranged along the straight line.

Here, the first transistor to the fourth transistor may be NMOS transistors. However, those skilled in the art may understand that the present disclosure is not limited thereto.

In the example arrangement as shown in FIG. 2, the straight line along which the plurality of first switch units and the plurality of second switch units are arranged is arranged at a side of the plurality of signal lines. That is, the switch assembly is arranged at a side of the plurality of signal lines. However, the example arrangement of the present disclosure is not limited thereto, and the straight line along which the plurality of first switch units and the plurality of second switch units are located may be arranged between the plurality of signal lines. That is, the switch assembly may be arranged between the plurality of signal lines.

Such example arrangement will be described below with reference to FIG. 3.

Figure 3:
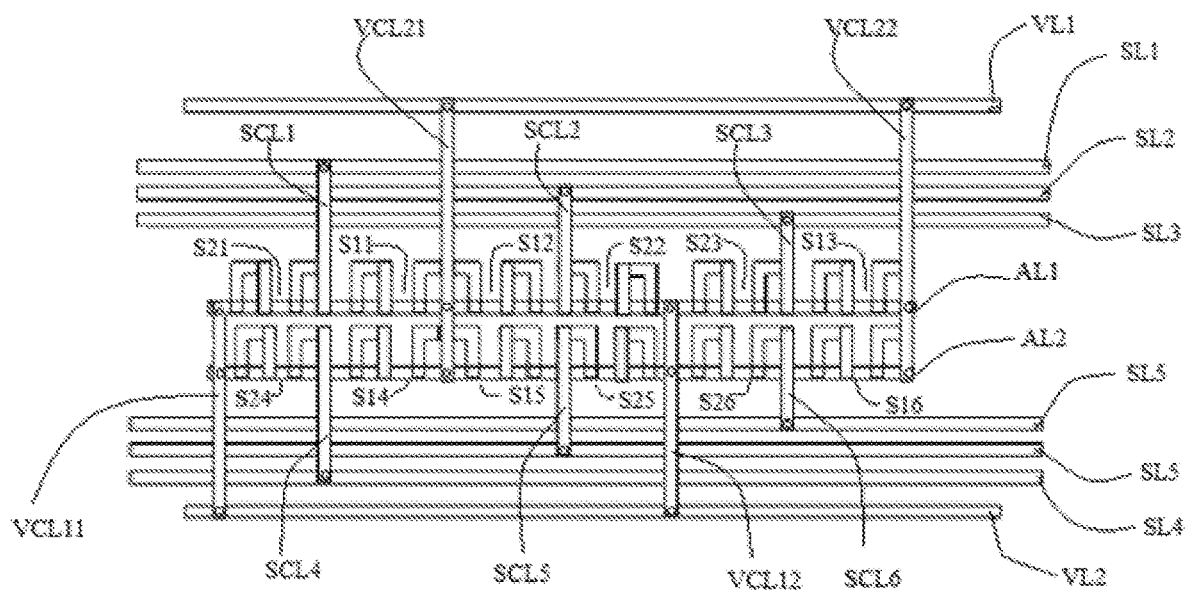
FIG. 3 illustrates a schematic diagram of an electrostatic protection circuit according to another example arrangement of the present disclosure.

FIG. 3 illustrates a schematic diagram of an electrostatic protection circuit according to another example arrangement of the present disclosure.

As shown in FIG. 3, the electrostatic protection circuit is used for a plurality of signal lines including a first signal line SL1 to a sixth signal line SL6, and a switch assembly of the electrostatic protection circuit is arranged between the plurality of signal lines including the first signal line SL1 to the third signal line SL3 and the plurality of signal lines including the fourth signal line SL4 to the sixth signal line SL6.

The electrostatic protection circuit may include: a first voltage line VL1, to which a high level voltage is applied; a second voltage line VL2, to which a low level voltage is applied; and a switch assembly, including a first switch assembly and a second switch assembly. In this example arrangement, the first switch assembly includes a plurality of first switch units S11-S13 and a plurality of second switch units S21-S23 arranged along a first straight line and sharing a first active layer AL1. The second switch assembly includes a plurality of first switch units S14-S16 and a plurality of second switch units S24-S26 arranged along a second straight line and sharing a second active layer AL2. In some example arrangements of the present disclosure, the first straight line along which the switch units of the first switch assembly are located and the second straight line along which the switch units of the second switch assembly are located may be arranged in parallel with each other.

Here, the first switch assembly is used for the first signal lines SL1 to SL3, and the second switch assembly is used for the fourth signal line SL4 to the sixth signal line SL6. In addition, the structures and arrangements as well as the connection with the signal lines of the first switch unit and the second switch unit in the first switch assembly are similar to those as shown in FIG. 2. Likewise, the structures and arrangements as well as the connection with the signal lines of the first switch unit and the second switch unit in the second switch assembly are similar to those as shown in FIG. 2. Thus, detailed descriptions thereof are omitted herein.

As shown in FIG. 3, the first switch assembly and the second switch assembly may be arranged between the plurality of signal lines. Specifically, the first straight line along which the first switch assembly is located and the second straight line along which the second switch assembly is located are arranged between the plurality of signal lines including the first signal line SL1 to the third signal line SL3 and the plurality of signal lines including the fourth signal line SL4 to the sixth signal line SL6. Such arrangement can reduce the number of the voltage line-connecting lines, such that the area occupied by the electrostatic protection circuit can be reduced, which is desirable for the narrow bezel design of the display device.

Specifically, in some arrangements, at least one first switch unit of the first switch assembly and at least one first switch unit of the second switch assembly may be coupled to the first voltage line through the same voltage line-connecting line, and at least one second switch unit of the first switch assembly and at least one second switch unit of the second switch assembly may be coupled to the second voltage line through the same voltage line-connecting line.

For example, as shown in FIG. 3, the first switch units S11 and S12 of the first switch assembly and the first switch units S14 and S15 of the second switch assembly are coupled to the first voltage line VL1 through the same second voltage line-connecting line VCL21. The first switch unit S13 of the first switch assembly and the first switch unit S16 of the second switch assembly are coupled to the first voltage line VL1 through the same fourth voltage line-connecting line VCL22. The second switch unit S21 of the first switch assembly and the second switch unit S24 of the second switch assembly are coupled to the second voltage line VL2 through the same first voltage line-connecting line VCL11. The second switch units S22 and S23 of the first switch assembly and the second switch units S25 and S26 of the second switch assembly are coupled to the second voltage line VL2 through the same third voltage line-connecting line VCL12.

In this example arrangement, a voltage line-connecting line may be shared by a plurality of first switch units or a plurality of second switch units. Thus, the number of the voltage line-connecting lines may be reduced, such that the area occupied by the electrostatic protection circuit may be reduced, which is desirable for the narrow bezel design of the display device.

As can be seen from the description of the above example arrangement of the present disclosure, the electrostatic protection circuit provided the example arrangement of the present disclosure occupies a smaller area, which is desirable for the narrow bezel design of the display device.

An example arrangement of the present disclosure also provides an array substrate including the above electrostatic protection circuit. In addition, the array substrate further includes a plurality of signal lines coupled to the electrostatic protection circuit. In some arrangements, the signal lines may be scan lines or data lines. In addition, in some arrangements, the first voltage line of the electrostatic protection circuit may be a gate high-voltage signal line, and the second voltage line of the electrostatic protection circuit may be a gate low-voltage signal line.

In addition, an example arrangement of the present disclosure also provides a display panel including the above array substrate.

The foregoing description of the particular example arrangements of the present disclosure has been given with reference to the accompanying drawings. These example arrangements are not intended to be exhaustive or limit the present disclosure to be the disclosed exact construction, and apparently, various modifications and changes can be made by those of ordinary skill in the art under the above teachings. Therefore, the scope of the present disclosure is not intended to be restricted to the foregoing arrangements but is intended to be limited by the claims and their equivalents.

What is claimed is:

1. An electrostatic protection circuit, comprising:
a first voltage line, applied with a first voltage;
a second voltage line, applied with a second voltage, which is lower than the first voltage; and
a switch assembly, comprising a plurality of first switch units and a plurality of second switch units arranged along a straight line and sharing an active layer;
wherein
the plurality of first switch units are respectively coupled between a plurality of signal lines of an array substrate and the first voltage line, and are turned on in response to negative static electricity on the plurality of signal lines; and
the plurality of second switch units are respectively coupled between the plurality of signal lines and the second voltage line, and are turned on in response to positive static electricity on the plurality of signal lines.

2. The electrostatic protection circuit according to claim 1, wherein the plurality of signal lines are arranged in a peripheral region of the array substrate.

3. The electrostatic protection circuit according to claim 1, wherein the straight line along which the plurality of first switch units and the plurality of second switch units are arranged is arranged at a side of the plurality of signal lines.

4. The electrostatic protection circuit according to claim 1, wherein each of the plurality of first switch units and each of the plurality of second switch units corresponding to a same one of the plurality of signal lines are arranged adjacent to each other.

5. The electrostatic protection circuit according to claim 4, wherein the first switch unit and the second switch unit corresponding to the same signal line forms a switch unit group, and the switch unit group corresponding to the same signal line is coupled to the same signal line through a same signal line-connecting line.

6. The electrostatic protection circuit according to claim 5, wherein the switch unit groups adjacent to each other are arranged in such a way that the first switch units are adjacent to each other or the second switch units are adjacent to each other.

7. The electrostatic protection circuit according to claim 6, wherein the first switch units adjacent to each other are coupled to the first voltage line through a same first voltage line-connecting line, and the second switch units adjacent to each other are coupled to the second voltage line through a same second voltage line-connecting line.

8. The electrostatic protection circuit according to claim 1, wherein the switch assembly comprises a first switch assembly and a second switch assembly;
the first switch units and the second switch units of the first switch assembly are arranged along a first straight line; and
the first switch units and the second switch units of the second switch assembly are arranged along a second straight line parallel to the first straight line.

9. The electrostatic protection circuit according to claim 8, wherein the plurality of signal lines comprise a plurality of first signal lines and a plurality of second signal lines, the first straight line along which the first switch assembly is arranged and the second straight line along which the second switch assembly is arranged are arranged between the plurality of first signal lines and the plurality of second signal lines.

10. The electrostatic protection circuit according to claim 9, wherein at least one of the first switch units in the first switch assembly and at least one of the first switch units in the second switch assembly are coupled to the first voltage line through a same first voltage line-connecting line, and at least one of the second switch units in the first switch assembly and at least one of the second switch units in the second switch assembly are coupled to the second voltage line through a same second voltage line-connecting line.

11. The electrostatic protection circuit according to claim 1, wherein each of the first switch units comprises a first transistor and a second transistor connected in series, and each of the second switch units comprises a third transistor and a fourth transistor connected in series.

12. The electrostatic protection circuit according to claim 11, wherein a first terminal of the first transistor is coupled to a first one of the plurality of signal lines, and a gate and a second terminal of the first transistor are coupled to each other;
a first terminal of the second transistor is coupled to the second terminal of the first transistor, and a second terminal and a gate of the second transistor are coupled to each other and are coupled to the first voltage line;
a first terminal and a gate of the third transistor are coupled to each other and are coupled to the first signal line; and
a first terminal and a gate of the fourth transistor are coupled to each other and are coupled to a second terminal of the third transistor, and a second terminal of the fourth transistor is coupled to the second voltage line.

13. The electrostatic protection circuit according to claim 12, wherein the first transistor, the second transistor, the third transistor, and the fourth transistor share the active layer arranged along the straight line.

14. An array substrate, comprising:
a plurality of signal lines, arranged in a peripheral region of the array substrate; and
an electrostatic protection circuit, coupled to the plurality of signal lines,
wherein the electrostatic protection circuit comprises:
a first voltage line, applied with a first voltage;
a second voltage line, applied with a second voltage, which is lower than the first voltage; and
a switch assembly, comprising a plurality of first switch units and a plurality of second switch units arranged along a straight line and sharing an active layer;
wherein
the plurality of first switch units are respectively coupled between the plurality of signal lines and the first voltage line, and are turned on in response to negative static electricity on the signal lines; and
the plurality of second switch units are respectively coupled between the plurality of signal lines and the second voltage line, and are turned on in response to positive static electricity on the signal lines.

15. The array substrate according to claim 14, wherein the first voltage line of the electrostatic protection circuit comprises a gate high-voltage signal line, and the second voltage line of the electrostatic protection circuit comprises a gate low-voltage signal line.

16. A display device, comprising an array substrate, wherein the array substrate comprises:
a plurality of signal lines, arranged in a peripheral region of the array substrate; and
an electrostatic protection circuit, coupled to the plurality of signal lines,
wherein the electrostatic protection circuit comprises:
a first voltage line, applied with a first voltage;
a second voltage line, applied with a second voltage, which is lower than the first voltage; and
a switch assembly, comprising a plurality of first switch unites and a plurality of second switch units arranged along a straight line and sharing an active layer;
wherein
the plurality of first switch units are respectively coupled between the plurality of signal lines and the first voltage line, and are turned on in response to negative static electricity on the plurality of signal lines; and
the plurality of second switch units are respectively coupled between the plurality of signal lines and the second voltage line, and are turned on in response to positive static electricity on the plurality of signal lines.

17. The electrostatic protection circuit according to claim 1, wherein the straight line extends in a direction along which the plurality of signal lines extend.

18. The array substrate according to claim 14, wherein the straight line along which the plurality of first switch units and the plurality of second switch units are arranged is arranged at a side of the plurality of signal lines.

19. The array substrate according to claim 18, wherein each of the plurality of first switch units and each of the plurality of second switch units corresponding to a same one of plurality of signal lines are arranged adjacent to each other.

20. The array substrate according to claim 19, wherein the first switch unit and the second switch unit corresponding to the same signal line forms a switch unit group, and the switch unit group corresponding to the same signal line is coupled to the signal line through a same signal line-connecting line.

* * * * *